United States Patent
Boecker et al.

(10) Patent No.: US 8,836,381 B2
(45) Date of Patent: Sep. 16, 2014

(54) PSEUDO-SUPPLY HYBRID DRIVER

(71) Applicant: MoSys, Inc., Santa Clara, CA (US)

(72) Inventors: Charles W. Boecker, Ames, IA (US); Eric Groen, Ankeny, IA (US)

(73) Assignee: MoSys, Inc., Santa Clara, CA (US)

( * ) Notice: Subject to any disclaimer, the term of this patent is extended or adjusted under 35 U.S.C. 154(b) by 0 days.

(21) Appl. No.: 13/787,692

(22) Filed: Mar. 6, 2013

(65) Prior Publication Data

US 2013/0342241 A1 Dec. 26, 2013

Related U.S. Application Data

(60) Provisional application No. 61/662,319, filed on Jun. 20, 2012.

(51) Int. Cl.
*H03B 1/00* (2006.01)
*H03K 17/16* (2006.01)

(52) U.S. Cl.
CPC .................................. *H03K 17/165* (2013.01)
USPC ........... 327/108; 327/403; 327/404; 327/410; 326/83

(58) Field of Classification Search
USPC ......... 327/108, 109, 306, 309, 318, 392, 398, 327/399, 403, 404, 407, 408, 409, 410, 427, 327/434; 326/82, 83
See application file for complete search history.

(56) References Cited

U.S. PATENT DOCUMENTS

| | | | |
|---|---|---|---|
| 5,402,387 A | 3/1995 | Hotta | |
| 5,801,548 A | 9/1998 | Lee et al. | |
| 6,246,270 B1 | 6/2001 | Wang et al. | |
| 6,812,733 B1 | 11/2004 | Plasterer et al. | |
| 6,940,302 B1 | 9/2005 | Shumarayev et al. | |
| 6,975,135 B1 | 12/2005 | Bui | |
| 7,109,743 B2 | 9/2006 | Shumarayev et al. | |
| 7,362,146 B2 | 4/2008 | Macaluso | |
| 7,501,851 B2 | 3/2009 | Venditti et al. | |
| 7,643,563 B2 | 1/2010 | Huang et al. | |
| 8,149,024 B2 | 4/2012 | Liu et al. | |
| 8,258,813 B2 | 9/2012 | Groepl et al. | |
| 8,493,103 B2 * | 7/2013 | Fukuda et al. ................. 327/112 |
| 8,570,881 B2 | 10/2013 | Talbot et al. | |
| 2005/0032501 A1 | 2/2005 | Huang et al. | |
| 2005/0057280 A1 * | 3/2005 | Groen et al. .................... 326/86 |
| 2008/0034378 A1 | 2/2008 | Kumar et al. | |

* cited by examiner

*Primary Examiner* — Lincoln Donovan
*Assistant Examiner* — Jung H Kim
(74) *Attorney, Agent, or Firm* — Bever, Hoffman & Harms, LLP

(57) ABSTRACT

A hybrid output driver includes a voltage mode main driver having an adjustable differential output voltage swing, and a current mode emphasis driver. Differential output voltage swing is adjusted by controlling the resistance of a first adjustable resistor coupled to a first voltage supply terminal, and the resistance of a second adjustable resistor coupled to a second voltage supply terminal. Resistances of the first and second adjustable resistors are adjusted by modifying a number of resistors connected in parallel. A calibration process measures the actual resistance of a similar resistor, and uses this resistance measurement to determine the number of resistors to be connected in parallel to provide the desired resistance. The current mode emphasis driver sources/sinks currents to/from differential output terminals of the hybrid output driver in response to an emphasis signal. These currents are selected in view of the selected differential output voltage swing and selected emphasis level.

27 Claims, 7 Drawing Sheets

PSEUDO-SUPPLY HYBRID DRIVER

RELATED APPLICATIONS

This application claims priority from U.S. Provisional Patent Application 61/662,319, entitled "Pseudo-Supply Hybrid Driver", which was filed on Jun. 20, 2012, and is incorporated by reference herein.

FIELD OF THE INVENTION

The present invention relates to a hybrid output driver that includes both a voltage mode component and a current mode component.

RELATED ART

The design of output driver circuits becomes more difficult as these circuits are required to operate at higher speeds (e.g., 12.5 Gb/s). Parameters that must be considered in the design of an output driver circuit include: operating speed, jitter, noise, required layout area, circuit complexity, return loss, power consumption, and emphasis variation accuracy. It would be desirable to have an improved output driver circuit design that is capable at operating at a high frequency, while minimizing jitter, noise, required layout area, circuit complexity, return loss and power consumption, while improving emphasis variation accuracy.

SUMMARY

Accordingly, the present invention provides a hybrid output driver circuit that includes a voltage mode main driver having an adjustable differential output voltage swing, and a current mode emphasis driver. The differential output voltage swing is adjusted by controlling the resistance of a first adjustable resistor coupled to a first voltage supply terminal, and the resistance of a second adjustable resistor coupled to a second voltage supply terminal. The resistances of the first and second adjustable resistors are adjusted by modifying a number of resistors connected in parallel. A calibration process measures the actual resistance of a resistor, and then uses this resistance measurement to determine the number of resistors to be connected in parallel to provide the desired resistance. The current mode emphasis driver sources/sinks currents to/from the differential output terminals of the hybrid output driver in response to an emphasis signal. These currents are selected in view of the selected differential output voltage swing.

The present invention will be more fully understood in view of the following description and drawings.

DETAILED DESCRIPTION

Figure 1:
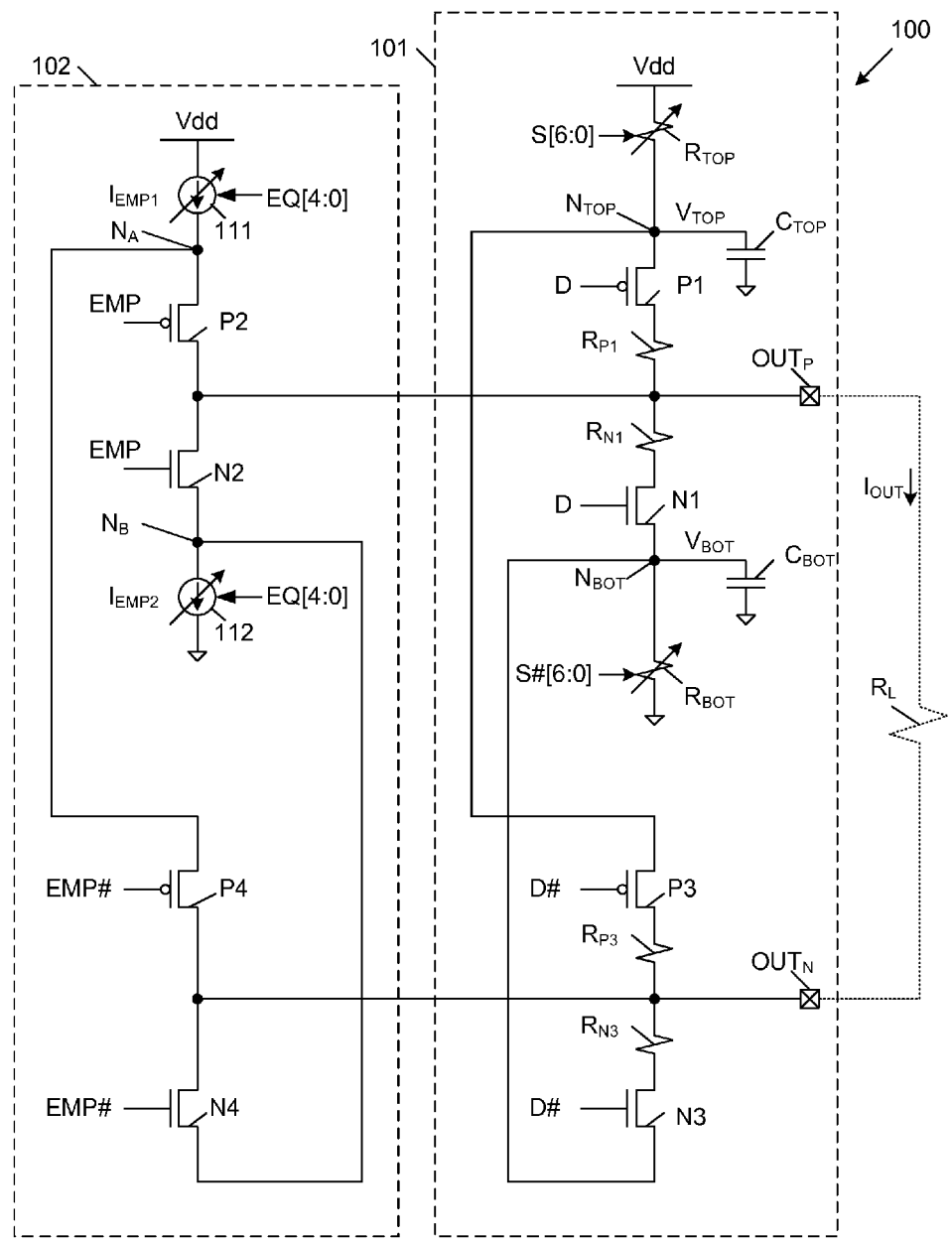
FIG. 1 is a circuit diagram of a hybrid output driver circuit in accordance with one embodiment of the present invention.

FIG. 1 is a circuit diagram of an output driver circuit 100 in accordance with one embodiment of the present invention. Output driver circuit 100 includes voltage mode main driver circuit 101 and current mode emphasis driver circuit 102. Because the output driver circuit 100 of FIG. 1 includes both a voltage mode driver component and a current mode driver component, this output driver circuit 100 may be referred to as a 'hybrid' driver circuit. As described in more detail below, voltage mode main driver circuit 101 is capable of operating with a programmable output voltage swing adjustment. As also described in more detail below, current mode emphasis driver circuit 102 performs an equalization/emphasis function within hybrid driver circuit 100.

Hybrid driver circuit 100 is a differential signal driver, which drives a differential output signal across output terminals $OUT_P$ and $OUT_N$, to an external load resistor $R_L$. In the embodiments described herein, the load resistor $R_L$ has a resistance of 100 Ohms. However, it is understood that the load resistor $R_L$ may have other resistances in other embodiments.

Voltage mode main driver circuit 101 includes p-channel transistors P1 and P3, n-channel transistors N1 and N3, fixed resistors $R_{P1}$, $R_{N1}$, $R_{P3}$ and $R_{N3}$, adjustable resistors $R_{TOP}$ and $R_{BOT}$, and capacitors $C_{TOP}$ and $C_{BOT}$. Adjustable resistor $R_{TOP}$ is coupled between the Vdd supply voltage terminal and node $N_{TOP}$. In the described embodiments, the Vdd supply voltage applied to the Vdd supply voltage terminal has a nominal value of 900 mV (although it is understood that other Vdd supply voltages can be used in other embodiments). Capacitor $C_{TOP}$ is connected between node $N_{TOP}$ and the ground supply terminal. As described in more detail below, adjustable resistor $R_{TOP}$ and capacitor $C_{TOP}$ form a pseudo-supply voltage circuit that provides a pseudo-supply voltage $V_{TOP}$ on node $N_{TOP}$, wherein $V_{TOP}$ is less than the Vdd supply voltage.

P-channel transistor P1 and resistor $R_{P1}$ are coupled in series between node $N_{TOP}$ and output terminal $OUT_P$, as illustrated. Resistor $R_{N1}$ and n-channel transistor N1 are coupled in series between output terminal $OUT_P$ and node $N_{BOT}$, as illustrated. Adjustable resistor $R_{BOT}$ and capacitor $C_{BOT}$ are coupled in parallel between node $N_{BOT}$ and the ground supply terminal. As described in more detail below, adjustable resistor $R_{BOT}$ and capacitor $C_{BOT}$ form a pseudo-supply voltage circuit that provides a pseudo-supply voltage $V_{BOT}$ on node $N_{BOT}$, wherein $V_{BOT}$ is greater than the ground supply voltage (0V).

P-channel transistor P3 and resistor $R_{P3}$ are coupled in series between node $N_{TOP}$ and output terminal $OUT_N$, as illustrated. Resistor $R_{N3}$ and n-channel transistor N3 are coupled in series between output terminal $OUT_N$ and node $N_{BOT}$, as illustrated.

The gates of transistors P1 and N1 are each coupled to receive an output data signal D, and the gates of transistors P3 and N3 are each coupled to receive the inverse of the output data signal D (i.e., D#).

Current mode emphasis driver circuit 102 includes p-channel transistors P2 and P4, n-channel transistors N2 and N4, and adjustable current supplies 111 and 112. Adjustable current supplies 111 and 112 provide adjustable emphasis currents $I_{EMP1}$ and $I_{EMP2}$, respectively. Adjustable current supply 111 is coupled between the Vdd voltage supply terminal and node $N_A$, and p-channel transistor P2 is coupled between node $N_A$ and the output terminal $OUT_P$. N-channel transistor N2 is coupled between the output terminal OUT and node $N_B$. Adjustable current supply 112 is coupled between node $N_B$ and ground. The gates of transistors P2 and N2 are coupled to receive the emphasis signal EMP.

P-channel transistor P4 is coupled between node NA and the output terminal $OUT_N$, and n-channel transistor N4 is coupled between the output terminal $OUT_N$ and node $N_B$. The gates of transistors P4 and N4 are coupled to receive the inverse of the emphasis signal EMP (i.e., EMP#).

Hybrid driver circuit 100 implements two tap finite impulse response (FIR) equalization in the illustrated embodiment. Although the present invention is described in connection with a two tap embodiment, it is understood that other numbers of current mode taps can be implemented, depending upon the desired amount of equalization. In the embodiment illustrated by FIG. 1, cursor data (D/D#) and post-cursor data (EMP/EMP#) correspond with the two taps. In the illustrated embodiment, the post-cursor data (EMP/EMP#) is the cursor data (D/D#) delayed by one cursor data bit and inverted. In other embodiments, different taps can implement pre-cursor data and/or post-cursor data. Each additional tap will replicate the structure represented by the adjustable current supplies 111-112 and transistors P2/N2 and P4/N4 of FIG. 1 (although these additional taps will be controlled by different data, depending upon the nature of the tap). In various embodiments, the emphasis signals used to control the various taps are time-shifted versions of the cursor data.

The operation of hybrid driver circuit 100 will now be described. In the described embodiments, fixed resistors $R_{P1}$, $R_{N1}$, $R_{P3}$ and $R_{N3}$ each have a resistance of 50 Ohms. The voltages on nodes $N_{TOP}$ and $N_{BOT}$ are designated $V_{TOP}$ and $V_{BOT}$, respectively. Capacitors $C_{TOP}$ and $C_{BOT}$ are sized to be large enough to make the voltages $V_{TOP}$ and $V_{BOT}$ look like constant voltages (i.e., pseudo-supply voltages) at the frequency of operation (i.e., the frequency at which the output data switches). Capacitors $C_{TOP}$ and $C_{BOT}$ are also sized to minimize low frequency return loss (i.e., capacitors $C_{TOP}$ and $C_{BOT}$ are sized to have negligible impedance at frequencies of about 50 to 100 MHz.) In one embodiment, each of the capacitors $C_{TOP}$ and $C_{BOT}$ has a capacitance of about 100 pF. In an alternate embodiment, each of the capacitors $C_{TOP}$ and $C_{BOT}$ can be implemented by a plurality of smaller capacitors coupled in parallel and distributed across (shared by) a plurality of voltage mode main drivers.

The resistances of adjustable resistors $R_{TOP}$ and $R_{BOT}$ are controlled to provide a desired reduced output voltage swing across output terminals $OUT_P$ and $OUT_N$. In one embodiment, each of the adjustable resistors $R_{TOP}$ and $R_{BOT}$ is controlled to have a resistance of 50 Ohms. As described in more detail below, this resistance provides a differential voltage swing of 600 mV across output terminals OUT and $OUT_N$. When the output (cursor) data value D has a logic '0' value (and the inverse output data value D# has a logic '1' value), transistors P1 and N3 are turned on, and transistors P3 and N1 are turned off. Under these conditions, the output voltage across the external load resistor $R_L$ (i.e., the voltage across output terminals $OUT_P$ and $OUT_N$) can be represented by the following equations.

$$OUT_P - OUT_N = I_{OUT} * R_L \quad \text{(Eq. 1)}$$

$$OUT_P - OUT_N = Vdd/(R_{TOP} + R_{P1} + R_L + R_{N3} + R_{BOT}) * R_L \quad \text{(Eq. 2)}$$

Given the exemplary values provided above, Equation (2) can be rewritten as follows.

$$OUT_P - OUT_N = 900 \text{ mV}/(50+50+100+50+50) * 100 \quad \text{(Eq. 4)}$$

$$OUT_P - OUT_N = 300 \text{ mV} \quad \text{(Eq. 5)}$$

wherein the voltage on output terminal OUTP is equal to 600 mV, and the voltage on output terminal OUTN is equal to 300 mV.

When the output data value D has a logic '1' value (and the inverse output data value D# has a logic '0' value), transistors P3 and N1 are turned on, and transistors P1 and N3 are turned off. Under these conditions, the output voltage across the load resistor RL (i.e., the voltage across output terminals OUTP and OUTN) can be represented by the following equations.

$$OUT_P - OUT_N = I_{OUT} * R_L \quad \text{(Eq. 6)}$$

$$OUT_P - OUT_N = -Vdd/(R_{TOP} + R_{P3} + R_L + R_{N1} + R_{BOT}) * R_L \quad \text{(Eq. 7)}$$

Given the exemplary values provided above, equation (7) can be rewritten as follows.

$$OUT_P - OUT_N = -900 \text{ mV}/(50+50+100+50+50) * 100 \quad \text{(Eq. 8)}$$

$$OUT_P - OUT_N = -300 \text{ mV} \quad \text{(Eq. 9)}$$

wherein the voltage on output terminal $OUT_P$ is equal to 300 mV, and the voltage on output terminal $OUT_N$ is equal to 600 mV.

The output voltage swing of voltage mode main driver 101 in the present example is therefore equal to 600 mV (i.e., 300 mV−(−300 mV)). Note that the pseudo-supply voltages VTOP and VBOT have values of 750 mV and 150 mV, respectively, in the above-described example.

In accordance with one embodiment of the present invention, the resistances of adjustable resistors $R_{TOP}$ and $R_{BOT}$ can be varied to modify the pseudo-supply voltages $V_{TOP}$ and $V_{BOT}$, and thereby the output voltage swing across the output terminals $OUT_P$ and $OUT_N$. For example, increasing the resistance of each of the adjustable resistors RTOP and RBOT to 100 Ohms will adjust the pseudo-supply voltages $V_{TOP}$ and $V_{BOT}$ to 675 mV and 225 mV, respectively, and will lower the nominal output current $I_{OUT}$ to 2.5 mA. Under these conditions, the output voltage swing across the output terminals $OUT_P$ and $OUT_N$ is lowered to a nominal value of 450 mV. Similarly, reducing the resistances of resistors $R_{TOP}$ and $R_{BOT}$ to 25 Ohms each will adjust the pseudo-supply voltages $V_{TOP}$ and $V_{BOT}$ to 810 mV and 90 mV, respectively, and will increase the nominal output current $I_{OUT}$ to 3.6 mA. Under these conditions, the output voltage swing across the output terminals $OUT_P$ and $OUT_N$ is increased to a nominal value of 720 mV.

Reducing the output voltage swing (by controlling the resistances of adjustable resistors $R_{TOP}$ and $R_{BOT}$ in the above-described manner) advantageously allows the emphasis currents $I_{EMP1}/I_{EMP2}$ of current emphasis mode driver circuit 102 to have a greater effect on the output signals provided on the output terminals $OUT_P$ and $OUT_N$.

Figure 2:
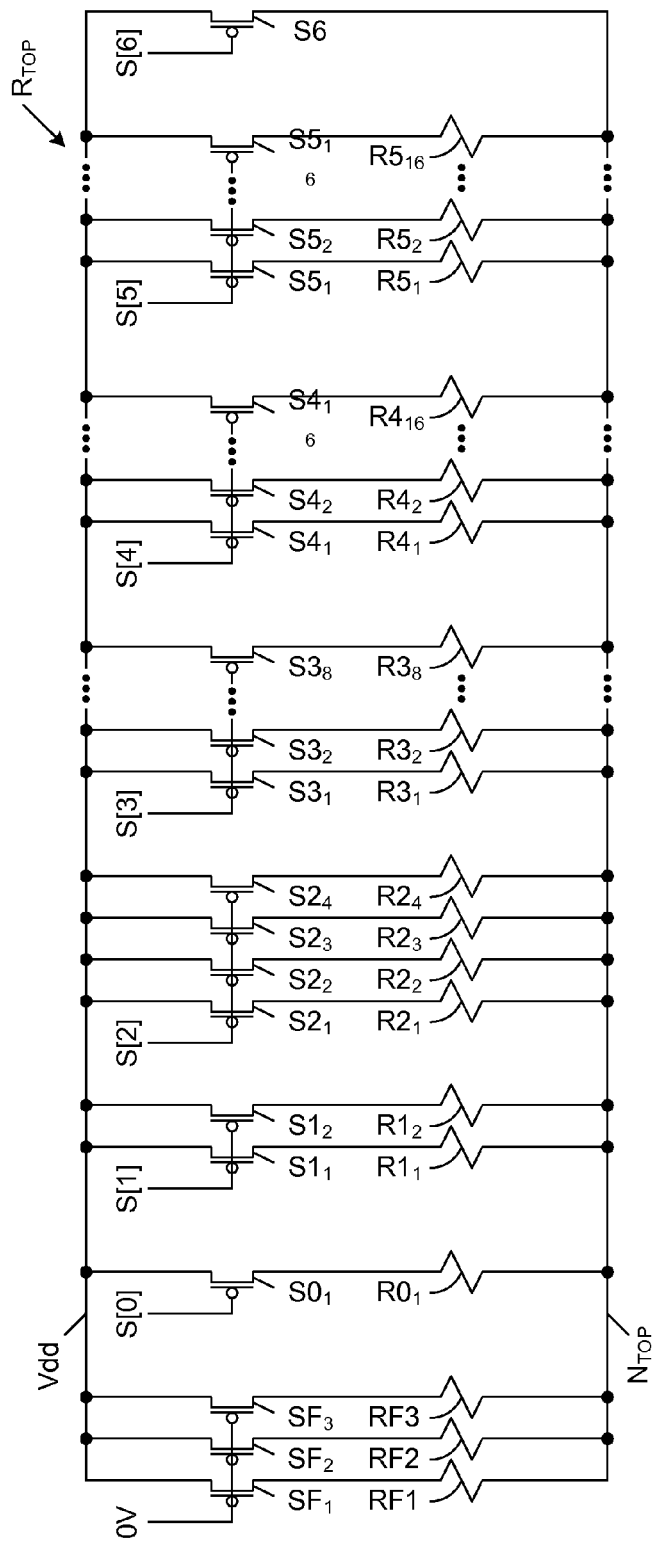
FIG. 2 is a circuit diagram of an adjustable resistor used in the hybrid output driver circuit of FIG. 1 in accordance with one embodiment of the present invention.

Calibration of voltage mode main driver 101 is important, because the output voltage swing will vary with variations in the resistances of the various resistors. In accordance with one embodiment of the present invention, calibration is performed using adjustable resistors $R_{TOP}$ and $R_{BOT}$. FIG. 2 is a circuit diagram illustrating adjustable resistor RTOP in accordance with one embodiment of the present invention.

Adjustable resistor RTOP includes fifty nominal 1000 Ohm (1 kOhm) resistive legs that are coupled in parallel between the Vdd voltage supply terminal and node $N_{TOP}$. Each of these resistive legs includes a polysilicon resistor and a p-channel transistor, which are connected in series between the Vdd supply terminal and node NTOP, as illustrated in FIG. 2. Each series-connected resistor/p-channel transistor exhibits a nominal resistance of 1 kOhm when the p-channel transistor is turned on (conductive).

Adjustable resistor RTOP includes three 'always connected' 1 kOhm resistive legs, which include resistors RF1-RF3 and p-channel transistors $SF_1$-$SF_3$. The gates of p-channel transistors $SF_1$-$SF_3$ are connected to the ground supply terminal (0V), such that these p-channel transistors $SF_1$-$SF_3$ are always on.

Adjustable resistor RTOP further includes a 1 kOhm resistive leg that includes resistor $R0_1$ and corresponding p-channel transistor $S0_1$. P-channel transistor $S0_1$ is controlled by switch control signal S[0]. When the switch control signal S[0] has a first logic state (e.g., S[0]='0'), p-channel transistor $S0_1$ becomes electrically conductive, thereby electrically connecting resistor $R0_1$ between the Vdd supply terminal and node $N_{TOP}$. Conversely, when the switch control signal S[0] has a second logic state (e.g., S[0]='1'), p-channel transistor S01 becomes electrically non-conductive, thereby electrically isolating resistor R01 from the Vdd voltage supply terminal.

Adjustable resistor $R_{TOP}$ further includes two parallel 1 kOhm resistive legs that include resistors $R1_1$-$R1_2$ and corresponding p-channel transistors $S1_1$-$S1_2$. Switch control signal S[1] controls the operation of p-channel transistors $S1_1$-$S1_2$ in the same manner that switch control signal S[0] controls the operation of p-channel transistor $S0_1$.

Adjustable resistor RTOP further includes four 1 kOhm parallel 1 kOhm resistive legs that include resistors $R2_1$-$R2_4$ and corresponding p-channel transistors $S2_1$-$S2_4$. Switch control signal S[2] controls the operation of p-channel transistors $S2_1$-$S2_4$ in the same manner that switch control signal S[0] controls the operation of p-channel transistor $S0_1$.

Adjustable resistor $R_{TOP}$ further includes eight 1 kOhm parallel resistive legs that include resistors $R3_1$-$R3_8$ and corresponding p-channel transistors $S3_1$-$S3_8$. Switch control signal S[3] controls the operation of p-channel transistors $S3_1$-$S3_8$ in the same manner that switch control signal S[0] controls the operation of p-channel transistor $S0_1$.

Adjustable resistor RTOP further includes sixteen 1 kOhm parallel resistive legs that include resistors $R4_1$-$R4_{16}$ and corresponding p-channel transistors $S4_1$-$S4_{16}$. Switch control signal S[4] controls the operation of p-channel transistors $S4_1$-$S4_{16}$ in the same manner that switch control signal S[0] controls the operation of p-channel transistor $S0_1$.

Adjustable resistor $R_{TOP}$ further includes sixteen 1 kOhm parallel resistive legs that include resistors $R5_1$-$R5_{16}$ and corresponding p-channel transistors $S5_1$-$S5_{16}$. Switch control signal S[5] controls the operation of p-channel transistors $S5_1$-$S5_{16}$ in the same manner that switch control signal S[0] controls the operation of p-channel transistor $S0_1$.

Finally, adjustable resistor RTOP further includes p-channel transistor S6, which is coupled directly between the Vdd supply terminal and node NTOP. P-channel transistor S6 is controlled by switch control signal S[6], wherein p-channel transistor S6 becomes electrically conductive when switch control signal S[6] has a first logic state (e.g., S[6]='0'). Under these conditions, the adjustable resistor RTOP has a negligible resistance, such that the full Vdd supply voltage (e.g., 900 mV) is applied directly to node NTOP (i.e., VTOP=900 mV). Note that when the adjustable resistor $R_{BOT}$ is similarly controlled to have a negligible resistance, the ground supply voltage is applied directly to node $N_{BOT}$ (i.e., $V_{BOT}$=0V). Under these conditions, voltage mode main driver 101 operates as a standard voltage-mode driver.

P-channel transistor S6 becomes electrically non-conductive when switch control signal S[6] has a second logic state (e.g., S[6]='1'). Under these conditions, the resistance of adjustable resistor $R_{TOP}$, and therefore the voltage on node NTOP, is determined by the values of the switch control signals S[5:0].

In the described embodiments, adjustable resistor $R_{BOT}$ is substantially identical to adjustable resistor $R_{TOP}$. However, adjustable resistor $R_{BOT}$ replaces the p-channel transistors of adjustable resistor $R_{TOP}$ with n-channel transistors, wherein these n-channel transistors are located between the corresponding resistors and to the ground supply terminal.

In accordance with one embodiment, adjustable resistor $R_{BOT}$ is controlled by the inverse of the same switch control signals (i.e., S#[6:0]), to account for the fact that the adjustable resistor $R_{BOT}$ implements n-channel transistors instead of p-channel transistors. As a result, the same number of resistive legs are enabled in both adjustable resistors $R_{TOP}$ and $R_{BOT}$. In this embodiment, the switch control signals S[6:0] may be selected by averaging the results obtained from an $R_{TOP}$ calibration circuit (see, e.g., FIG. 3A below), and an $R_{BOT}$ calibration circuit (see, e.g., FIG. 3B below). In an alternate embodiment, the switch control signals S[6:0] used to control adjustable resistor $R_{TOP}$ are obtained from the $R_{TOP}$ calibration circuit, and the switch control signals S#[6:0] used to control adjustable resistor $R_{BOT}$ are obtained from the $R_{BOT}$ calibration circuit. In this embodiment, the number of resistive legs enabled in adjustable resistors $R_{TOP}$ and $R_{BOT}$ will likely be the same, but may be different. In this embodiment, the number of resistive legs enabled in adjustable resistors RTOP and RBOT will likely be the same, but may be different. As described in more detail below, adjustable resistors $R_{TOP}$ and $R_{BOT}$, once calibrated, will exhibit substantially identical resistances.

Note that if each of the resistive legs of FIG. 2 actually exhibits a resistance of 1 kOhms, then connecting 20 of these resistive legs in parallel between the Vdd voltage supply terminal and node NTOP (i.e., setting S[6:0]='1101110') would provide a resistor RTOP having a resistance of 50 Ohms. However, due to process variations, it is possible that each of the resistive legs of FIG. 2 may have a value slightly different than 1 kOhms. Thus, in accordance with one embodiment of the present invention, a calibration process is initially performed, wherein an actual resistance of a replica resistive leg is measured, and this measurement is used to select a number of resistors to be connected in parallel to provide a desired resistance.

Figure 3A:
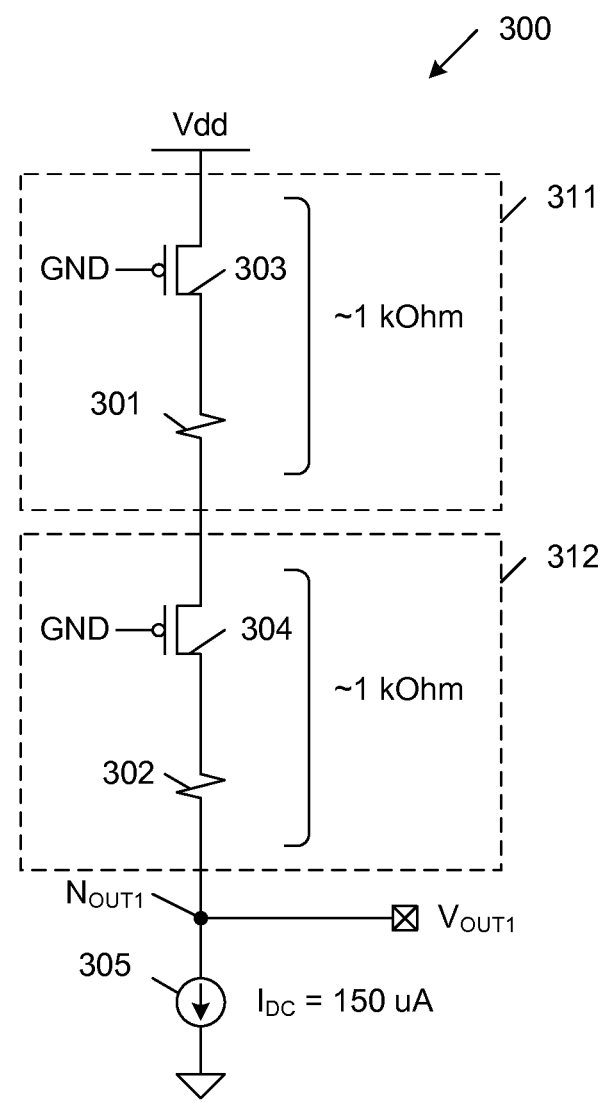
FIGS. 3A and 3B are circuit diagrams of calibration circuits that are used to implement a calibration process of the hybrid output driver circuit of FIG. 1 in accordance with one embodiment of the present invention.
Figure 3B:
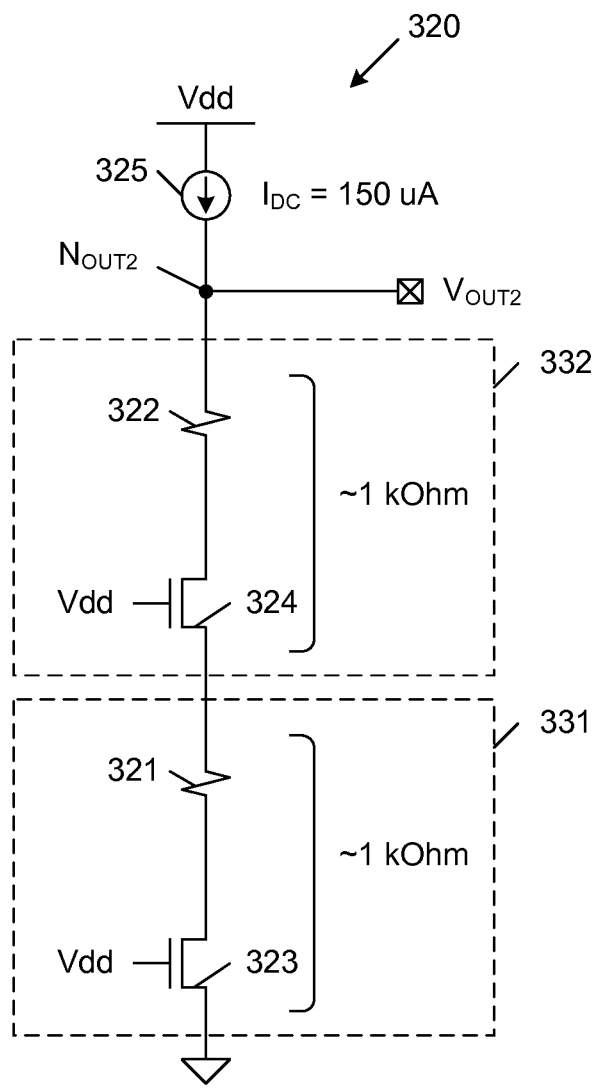

FIGS. 3A and 3B are circuit diagrams of calibration circuits 300 and 320, respectively, which are used to implement the calibration process in accordance with one embodiment of the present invention.

Calibration circuit 300 is used to implement the calibration of resistor $R_{TOP}$. As illustrated by FIG. 3A, calibration circuit 300 includes a first resistive leg 311 that includes resistor 301 and p-channel transistor 303, a second resistive leg 312 that includes resistor 302 and p-channel transistor 304, and current supply 305. Resistive legs 311 and 312 are connected in series between the Vdd voltage supply terminal and node $N_{OUT1}$. Current supply 305 sinks a current $I_{DC}$ from node $N_{OUT1}$ to ground, whereby the current $I_{DC}$ flows through resistive legs 311 and 312. In the described embodiment, resistive leg 311 has an identical layout and design as the 1 kOhm resistive legs used to implement the resistor $R_{TOP}$, (e.g., resistor $R0_1$ and p-channel transistor $S0_1$ of FIG. 2). Also in this embodiment, resistive leg 312 has an identical layout and design as 1 kOhm resistive legs which are used to implement the resistor RP1. The current IDC is selected to correspond with the expected current flowing through corresponding resistive legs in resistors RTOP and RP1 for a selected output voltage swing. In the example described above, when voltage mode main driver 101 is configured to operate with an output voltage swing of 600 mV, the Vdd supply voltage is 900 mV, the output current IOUT has a nominal value of 3 mA, and each of the resistors RTOP and RP1 has a value of 50 Ohms, which is ideally provided by twenty 1 kOhm resistive legs connected in parallel. In this example, the expected current through each 1 kOhm resistive leg would be 150 microAmps (uA) (i.e., 3 mA/20 parallel 1 kOhm resistive legs). Thus, as illustrated in FIG. 3A, the current supply 303 is configured to draw a current IDC equal to the expected current of 150 uA, and the voltage VOUT1 is measured. Because the Vdd supply voltage is 900 mV, the expected value of VOUT1 is 600 mV (i.e., 900 mV−(2000 Ohms*150 uA)), assuming that the resistance of each of the resistive legs 311-312 is actually 1 kOhm. However, depending on variations in the process used to fabricate the resistive legs, it is possible for the resistive legs to have actual resistances less than or greater than 1 kOhm.

A measured voltage VOUT1 less than 600 mV indicates that the resistive legs 311-312 have actual resistances greater than 1 kOhm (i.e., indicates a 'slow' process), while a measured voltage VOUT1 greater than 600 mV indicates that the resistive legs 311-312 have actual resistances less than 1 kOhm (i.e., indicates a 'fast' process). The measured voltage VOUT1 is used to select a calibration value from 0 to 10 from a lookup table. A calibration value of '5' indicates a normal process, wherein resistive legs 311-312 have actual resistances of 1 kOhm. Higher calibration values indicate that the resistive legs 311-312 have actual resistances greater than 1 kOhm, and lower calibration values indicate that the resistive legs 311-312 have actual resistances less than 1 kOhm.

Figure 4:
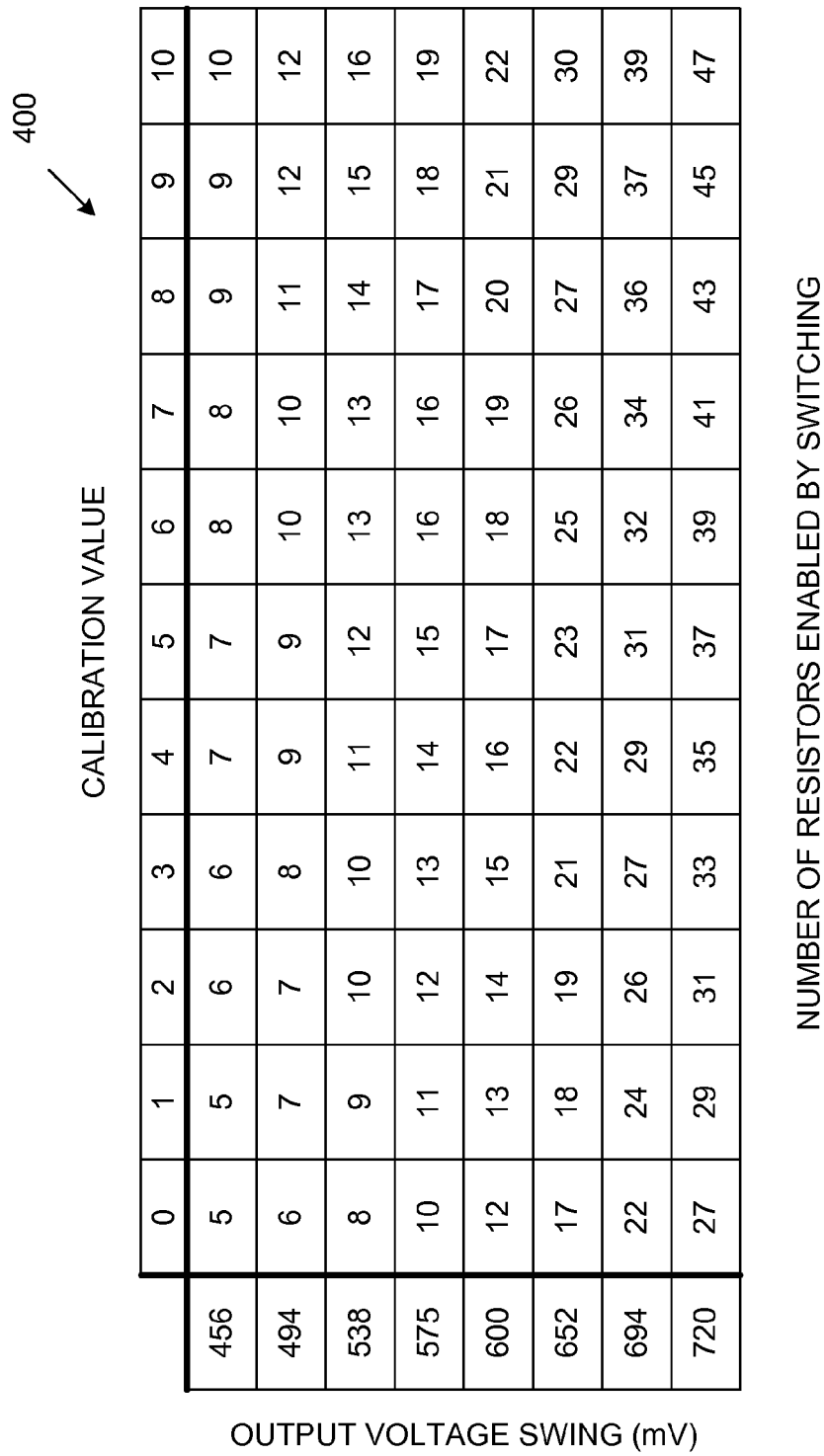
FIG. 4 is a calibration lookup table used to configure the adjustable resistor of FIG. 2 in accordance with one embodiment of the present invention.

FIG. 4 is a calibration lookup table 400 in accordance with one embodiment of the present invention. Using the calibration table 400, the number of resistive legs to be enabled within the resistor RTOP of FIG. 2 can be determined in response to the selected output voltage swing and the calibration code. For example, for an output voltage swing of 600 mV, and a calibration code of '5', calibration lookup table 400 indicates that 17 1 kOhm resistive legs must be electrically connected between the Vdd supply terminal and node NTOP (in addition to the 3 fixed 1 kOhm resistive legs represented by resistors RF1-RF3 and p-channel transistors SF1-SF3) within the RTOP resistor structure of FIG. 2. In order to accomplish this, the switch value S[6:0] may be given a value of '1101110', such that p-channel transistors S0$_1$ and S4$_1$-S4$_{16}$ are turned on, and p-channel transistors S1$_1$-S1$_2$, S2$_1$-S2$_4$, S3$_1$-S3$_8$, S5$_1$-S5$_{16}$ and S6 are turned off. Under these conditions, a total of 20 1 kOhm resistive legs (including resistors RF1, RF2, RF3, R0$_1$ and R4$_1$-R4$_{16}$) are electrically connected between the Vdd supply terminal and node N$_{TOP}$ for an equivalent resistance of 50 Ohms.

Similarly, for an output voltage swing of 600 mV, and a calibration code of '8', calibration lookup table 400 indicates that 20 1 kOhm resistive legs must be electrically connected between the Vdd supply terminal and node N$_{TOP}$ (in addition to the 3 fixed 1 kOhm resistive legs represented by resistors RF1-RF3 and p-channel transistors SF$_1$-SF$_3$) within the R$_{TOP}$ resistor structure of FIG. 2. In the present example, a calibration code of '8' indicates that each of the resistive legs in the adjustable resistor R$_{TOP}$ has an actual resistance of about 1150 Ohms. To switch in the desired number of resistors, the switch value S[6:0] may be given a value of '1101011', such that p-channel transistors S2$_1$-S2$_4$ and S4$_1$-S4$_{16}$ are turned on, and p-channel transistors S0$_1$, S1$_1$-S1$_2$, S3$_1$-S3$_8$, S5$_1$-S5$_{16}$ and S6 are turned off. Under these conditions, a total of 23 1150 Ohm resistive legs (including resistors RF1, RF2, RF3, R2$_1$-R2$_4$ and R4$_1$-R4$_{16}$) are electrically connected between the Vdd supply terminal and node N$_{TOP}$ for an equivalent resistance of 50 Ohms.

Although the calibration of adjustable resistor R$_{TOP}$ is described above, it is understood that resistor R$_{P1}$ may be calibrated to have a resistance of 50 Ohms in the same manner as adjustable resistor RTOP. That is, the calibration value derived from calibration circuit 300 can be used to access a calibration table similar to calibration table 400 in order to determine the number of 1 kOhm resistive legs to be coupled in parallel to create a resistor R$_{P1}$ having a 50 Ohm resistance. Because resistor R$_{P1}$ will always have a value of 50 Ohms (in contrast with adjustable resistor R$_{TOP}$, which may have other resistances, e.g., 25 Ohms or 100 Ohms) for different output voltage swings, as described above), it may be possible to control the resistance of resistor R$_{P1}$ using fewer switches/switch control signals than adjustable resistor R$_{TOP}$. In one embodiment, resistor RP1 may be calibrated to a 50 Ohm value by selectively connecting between fifteen and twenty-five nominal 1 kOhm resistive legs in parallel, depending on the calibration results.

Calibration circuit 320 is used to implement the calibration of resistor R$_{BOT}$. As illustrated by FIG. 3B, calibration circuit 320 includes a first 1 kOhm resistive leg 331 that includes resistor 321 and n-channel transistor 323, a second 1 kOhm resistive leg 332 that includes resistor 322 and n-channel transistor 324, and current supply 325. Resistive legs 331 and 332 are connected in series between the ground voltage supply terminal and node NOUT2. Current supply 325 sources the current IDC (described above) into node NOUT2, whereby the current IDC flows through resistive legs 331 and 332. In the described embodiment, resistive leg 331 has an identical layout and design as the 1 kOhm resistive legs used to implement the resistor R$_{BOT}$, and resistive leg 322 has an identical layout and design as 1 kOhm resistive legs which are used to implement the resistor R$_{N1}$.

As described above, the current IDC is selected to correspond with the expected current flowing through the resistive legs 331-332 for the selected output voltage swing. In the example described above, current supply 325 provides a current IDC of 150 uA. The output voltage V$_{OUT2}$ on node N$_{OUT2}$ is measured with the current I$_{DC}$ flowing through resistive legs 331-332. A measured voltage V$_{OUT2}$ of 300 mV indicates that each of the resistive legs 331-332 has a resistance of 1 kOhm (normal process). A measured voltage V$_{OUT2}$ less than 300 mV indicates that the resistive legs 331-332 have actual resistances greater than 1 kOhm (i.e., indicates a 'slow' process), while a measured voltage V$_{OUT2}$ greater than 300 mV indicates that the resistive legs 331-332 have actual resistances less than 1 kOhm (i.e., indicates a 'fast' process). Again, a calibration value is selected in response to the measured voltage V$_{OUT2}$, and this calibration value is used to access calibration lookup table 400, thereby providing the number of resistive legs to be enabled within the adjustable resistor R$_{BOT}$. Again, the resistor R$_{N1}$ can be calibrated to exhibit a 50 Ohm value in the same manner described above for resistor R$_{P1}$.

In one embodiment, the calibration values determined by calibration circuits 300 and 320 are averaged, and the resulting averaged calibration value is used to access calibration table 400, with the result being used to control the number of resistive legs enabled within both adjustable resistors R$_{TOP}$ and R$_{BOT}$.

Current mode emphasis driver 102 (FIG. 1) will now be described in more detail. In general, current mode emphasis driver 102 adds and subtracts current from the nominal output of hybrid driver circuit 100, thereby providing equalization to the output current (and voltage). That is, the currents $I_{EMP1}/I_{EMP2}$ are mirrored to the output terminals $OUT_P/OUT_N$ in response to the EMP/EMP# signals. The emphasis amount varies mainly due to variations in the output voltage swing of voltage mode driver circuit 101. The current values of $I_{EMP1}/I_{EMP2}$ associated with adjustable current supplies 111 and 112 can be adjusted in increments of 150 uA in response to an equalization control signal EQ[4:0], wherein bits EQ[4], EQ[3], EQ[2], EQ[1], and EQ[0], when activated, add currents of 2400 uA, 1200 uA, 600 uA, 300 uA and 150 uA, respectively, to $I_{EMP1}$ and $I_{EMP2}$. When hybrid output driver 100 implements an output voltage swing of 600 mV, the 150 uA step size corresponds with a step size of about 0.45 dB, or about 2.5%. The maximum output voltage swing is limited by the headroom of current mode emphasis driver 102.

In accordance with one embodiment of the present invention, reducing the output voltage swing of voltage mode main driver 101 allows the emphasis currents $I_{EMP1}/I_{EMP2}$ of the current mode emphasis driver 102 to be more effective at providing equalization to the output of hybrid driver circuit 100. For example, by reducing the output voltage swing of voltage main mode driver 101 to 600 mV, the equalization provided by the emphasis currents $I_{EMP1}/I_{EMP2}$ increases from about 4 dB to about 8 dB (with an emphasis current of about 2700 uA), when compared to a similar voltage main mode driver 101 that does not include adjustable resistors $R_{TOP}$ and $R_{BOT}$. As a result, hybrid mode driver 100 is capable of operating with a relatively low power consumption. In one embodiment, hybrid mode driver 100 is capable of operating at a data transfer rate of 12.5 Gigabits (Gb)/sec with typical/worst case power consumption of about 3.5 mW/4.1 mW, with no emphasis current. Similarly, hybrid mode driver 100 is capable of operating at a data transfer rate of 15 Gb/sec with typical/worst case power consumption of about 3.5 mW/4.2 mW, with no emphasis current. Power consumption increases as the emphasis current increases. This compares favorably with the power consumption of current generation drivers, which typically exhibit power consumption of about 8-10 mW for similar performance.

Figure 5:
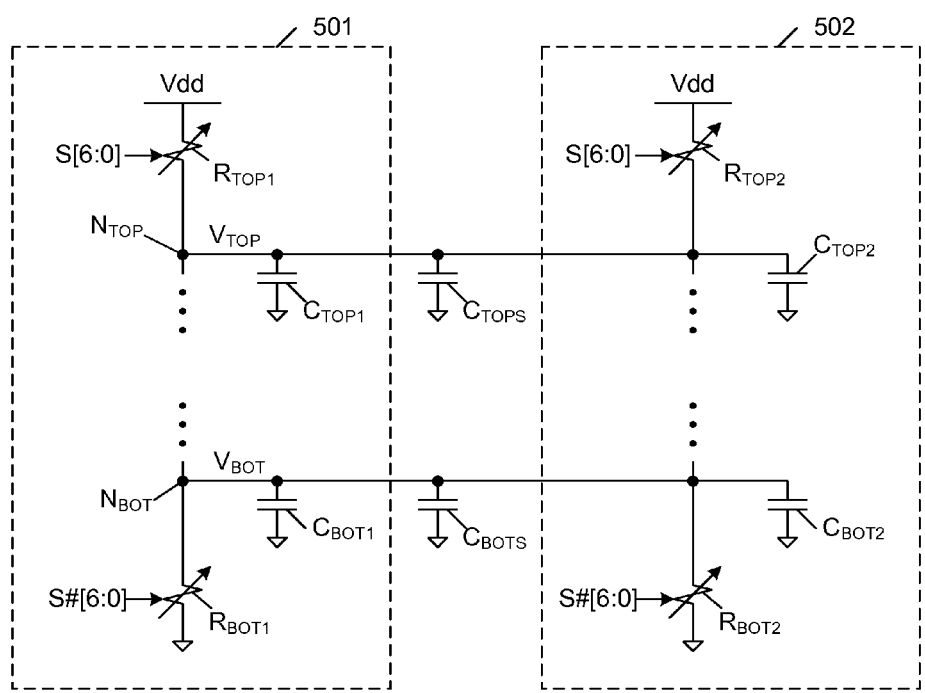
FIG. 5 is a circuit diagram illustrating multiple capacitors shared across multiple hybrid output driver circuits in accordance with one embodiment of the present invention.

In one embodiment, capacitors $C_{TOP}$ and $C_{BOT}$ can each be implemented by multiple capacitors, some of which are shared among multiple hybrid driver circuits. FIG. 5 is a circuit diagram that illustrates a pair of hybrid driver circuits 501-502 that implement multiple capacitors in accordance with one such embodiment. In the embodiment illustrated by FIG. 5, the 100 pF capacitor $C_{TOP}$ of hybrid driver circuit 100 (FIG. 1) is replaced by replaced by a first 25 pF capacitor $C_{TOP1}$ included within hybrid driver circuit 501, a second 25 pF $C_{TOP2}$ included within hybrid driver circuit 502, and a 50 pF capacitor $C_{TOPS}$ shared by hybrid driver circuits 501-502. Similarly, the 100 pF capacitor $C_{BOT}$ of hybrid driver circuit 100 (FIG. 1) is replaced by replaced by a first 25 pF capacitor $C_{BOT1}$ included within hybrid driver circuit 501, a second 25 pF $C_{BOT2}$ included within hybrid driver circuit 502, and a 50 pF capacitor $C_{BOTS}$ shared by hybrid driver circuits 501-502. Other capacitor sharing configurations would be obvious in view of the present disclosure, including, but not limited to, sharing one or more capacitors among more than two hybrid driver circuits.

Figure 6:
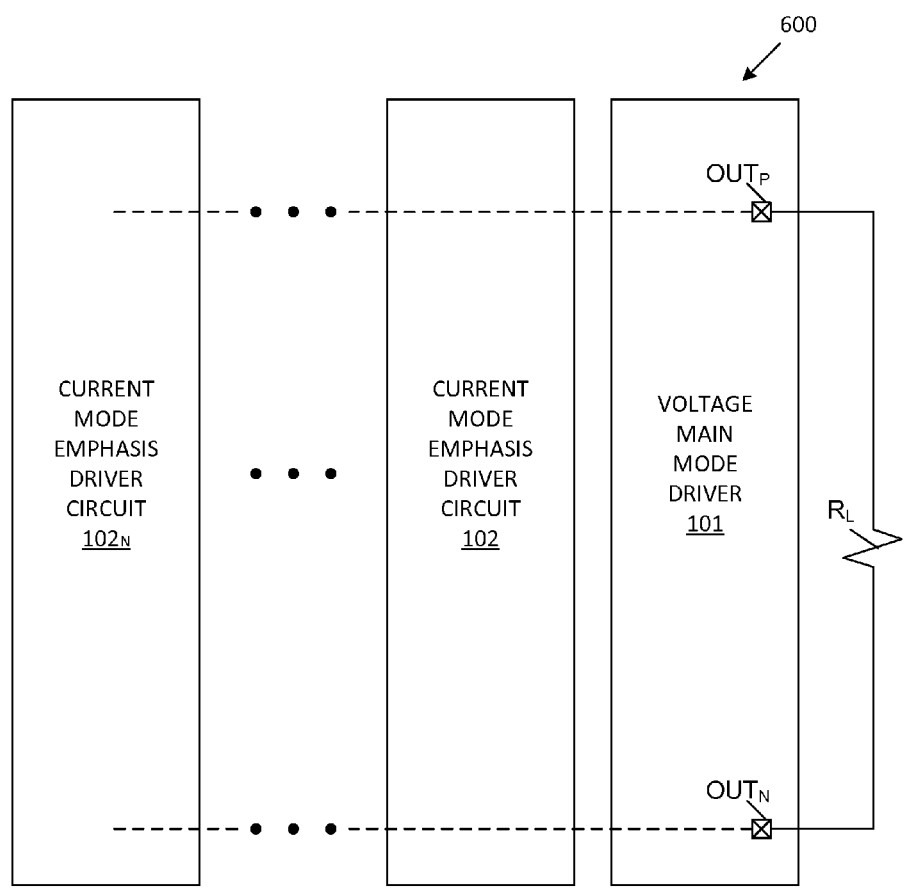
FIG. 6 is a block diagram of a hybrid output driver circuit having a plurality of parallel emphasis circuits in accordance with one embodiment of the present invention.

Although the present invention has been described in connection with several embodiments, it is understood that this invention is not limited to the embodiments disclosed, but is capable of various modifications which would be apparent to one of ordinary skill in the art. For example, although the hybrid driver circuit 100 has been described in connection with a single emphasis driver circuit 102, it is understood that additional emphasis driver circuits can be coupled in parallel with emphasis driver circuit 102, thereby providing additional taps to the hybrid driver circuit 100. FIG. 6 is a block diagram, of a hybrid driver circuit 600 in accordance with such an embodiment, wherein one or more additional emphasis driver circuits 102N are coupled in parallel with current mode emphasis driver circuit 102, thereby providing increased functionality in terms of equalization. In a particular embodiment, up to six emphasis driver circuits (6 taps) are coupled in parallel with the voltage main mode driver 101. In one embodiment, each of the one or more additional emphasis driver circuits $102_N$ provides emphasis currents to the differential output terminals $OUT_P$ and $OUT_N$ in response to a corresponding emphasis signal, in a manner similar to that described above in connection with current mode emphasis driver circuit 102.

Moreover, although the present specification teaches that the resistances of adjustable resistors $R_{TOP}$ and $R_{BOT}$ are controlled to provide a desired reduced output voltage swing across output terminals $OUT_P$ and $OUT_N$, it is understood that other circuit elements of voltage main mode driver 101 (e.g., P1, N1, P3, N3 and the associated resistors $R_{P1}$, $R_{N1}$, $R_{P3}$ $R_{N3}$) could be similarly calibrated, either separately, or in combination, to achieve the same described results. Thus, the invention is limited only by the following claims.

We claim:

1. A driver circuit comprising:
    a voltage mode main driver including:
        a first voltage adjusting circuit that provides an adjustable first pseudo-supply voltage to a first node in response to a first supply voltage;
        a second voltage adjusting circuit that provides an adjustable second pseudo-supply voltage to a second node in response to a second supply voltage;
        switching circuitry that selectively couples a first one of the first and second nodes to a first differential output terminal, and a second one of the first and second nodes, different than the first one of the first and second nodes, to a second differential output terminal, in response to a data signal; and
        means for controlling the first and second voltage adjusting circuits to adjust the first and second pseudo-supply voltages to select an output voltage swing across the first and second differential output terminals; and
    a current mode emphasis driver that selectively couples a first one of the first and second differential output terminals to a first current supply, and a second one of the first and second differential output terminals, different than the first one of the first and second differential output terminals, to a second current supply, in response to an emphasis signal.

2. The driver circuit of claim 1, wherein the first voltage adjusting circuit comprises a first adjustable resistor having a first terminal coupled to receive the first supply voltage and a second terminal coupled to the first node.

3. The driver circuit of claim 2, wherein the first voltage adjusting circuit further comprises a first capacitor coupled to the first node.

4. A driver circuit comprising:
    a voltage mode main driver including:
        a first voltage adjusting circuit that provides an adjustable first pseudo-supply voltage to a first node in response to a first supply voltage, wherein the first voltage adjusting circuit comprises:

a first adjustable resistor having a first terminal coupled to receive the first supply voltage and a second terminal coupled to the first node;

a first capacitor coupled to the first node; and a second capacitor coupled in parallel with the first capacitor;

a second voltage adjusting circuit that provides an adjustable second pseudo-supply voltage to a second node in response to a second supply voltage; and switching circuitry that selectively couples a first one of the first and second nodes to a first differential output terminal, and a second one of the first and second nodes, different than the first one of the first and second nodes, to a second differential output terminal, in response to a data signal; and a current mode emphasis driver that selectively couples a first one of the first and second differential output terminals to a first current supply, and a second one of the first and second differential output terminals, different than the first one of the first and second differential output terminals, to a second current supply, in response to an emphasis signal.

5. The driver circuit of claim 2, wherein the second voltage adjusting circuit comprises a second adjustable resistor having a first terminal coupled to receive the second supply voltage and a second terminal coupled to the second node.

6. The driver circuit of claim 5, wherein the first voltage adjusting circuit further comprises a first capacitor coupled to the first node, and the second voltage adjusting circuit further comprises a second capacitor coupled to the second node.

7. The driver circuit of claim 1, wherein the emphasis signal is derived from the data signal.

8. The driver circuit of claim 7, wherein the emphasis signal is a time-shifted version of the data signal.

9. The driver circuit of claim 1, wherein the first pseudo-supply voltage is less than the first supply voltage, and wherein the second pseudo-supply voltage is greater than the second supply voltage.

10. The driver circuit of claim 1, wherein the switching circuitry comprises:
a first transistor and a first resistor coupled in series between the first node and the first differential output terminal;
a second transistor and a second resistor coupled in series between the second node and the first differential output terminal;
a third transistor and a third resistor coupled in series between the first node and the second differential output terminal; and
a fourth transistor and a fourth resistor coupled in series between the second node and the second differential output terminal.

11. A driver circuit comprising:
a voltage mode main driver including:
a first voltage adjusting circuit that provides an adjustable first pseudo-supply voltage to a first node in response to a first supply voltage, wherein the first voltage adjusting circuit comprises a first adjustable resistor having a first terminal coupled to receive the first supply voltage and a second terminal coupled to the first node, wherein the first adjustable resistor comprises a plurality of sets of one or more resistors, each of the sets of one or more resistors being selectively switchable between the first supply voltage and the first node;

a second voltage adjusting circuit that provides an adjustable second pseudo-supply voltage to a second node in response to a second supply voltage; and switching circuitry that selectively couples a first one of the first and second nodes to a first differential output terminal, and a second one of the first and second nodes, different than the first one of the first and second nodes, to a second differential output terminal, in response to a data signal; and a current mode emphasis driver that selectively couples a first one of the first and second differential output terminals to a first current supply, and a second one of the first and second differential output terminals, different than the first one of the first and second differential output terminals, to a second current supply, in response to an emphasis signal.

12. The driver circuit of claim 11, wherein the first adjustable resistor further comprises one or more resistors permanently connected between the first supply voltage and the first node.

13. A driver circuit comprising:
a voltage mode main driver including:
a first voltage adjusting circuit that provides an adjustable first pseudo-supply voltage to a first node in response to a first supply voltage;
a second voltage adjusting circuit that provides an adjustable second pseudo-supply voltage to a second node in response to a second supply voltage; and
switching circuitry that selectively couples a first one of the first and second nodes to a first differential output terminal, and a second one of the first and second nodes, different than the first one of the first and second nodes, to a second differential output terminal, in response to a data signal;
a current mode emphasis driver that selectively couples a first one of the first and second differential output terminals to a first current supply, and a second one of the first and second differential output terminals, different than the first one of the first and second differential output terminals, to a second current supply, in response to an emphasis signal; and
a calibration circuit that measures an actual resistance of a first set of one or more resistors, and in response, determines a first number of resistors to be connected in parallel between the first supply voltage and the first node.

14. The driver circuit of claim 13, wherein the calibration circuit further measures an actual resistance of a second set of one or more resistors, and in response, determines a second number of resistors to be connected in parallel between the second supply voltage and the second node.

15. The driver circuit of claim 1, further comprising means for adjusting currents of the first and second current supplies in response to the selected output voltage swing.

16. The driver circuit of claim 15, further comprising means for adjusting currents of the first and second current supplies in response to the emphasis signal.

17. The driver circuit of claim 1, further comprising a second current mode emphasis driver circuit coupled in parallel with the current mode emphasis driver.

18. A method of implementing a differential output driver, comprising:
providing an adjustable first pseudo-supply voltage to a first node in response to a first supply voltage on a first voltage supply terminal;

providing an adjustable second pseudo-supply voltage on a second node in response to a second supply voltage on a second voltage supply terminal;

coupling a first one of the first and second nodes to a first differential output terminal, in response to a data signal;

coupling a second one of the first and second nodes, different than the first one of the first and second nodes, to a second differential output terminal, in response to the data signal;

coupling a first one of the first and second differential output terminals to a first current supply in response to an emphasis signal;

coupling a second one of the first and second differential output terminals, different than the first one of the first and second differential output terminals, to a second current supply in response to the emphasis signal;

selecting the first and second pseudo-supply voltages to provide an output voltage swing across the first and second differential output terminals; and adjusting currents of the first and second current supplies in response to the output voltage swing.

19. The method of claim 18, wherein the step of providing the adjustable first pseudo-supply voltage comprises selecting a resistance of a first adjustable resistor coupled between the first voltage supply terminal and the first node.

20. The method of claim 18, wherein the step of providing the adjustable first pseudo-supply voltage comprises coupling a first capacitor to the first node.

21. A method of implementing a differential output driver, comprising:

providing an adjustable first pseudo-supply voltage to a first node in response to a first supply voltage on a first voltage supply terminal, wherein providing the adjustable first pseudo-supply voltage comprises:

selecting a resistance of a first adjustable resistor coupled between the first voltage supply terminal and the first node;

coupling a first capacitor to the first node; and coupling a second capacitor in parallel with the first capacitor;

providing an adjustable second pseudo-supply voltage on a second node in response to a second supply voltage on a second voltage supply terminal;

coupling a first one of the first and second nodes to a first differential output terminal, in response to a data signal;

coupling a second one of the first and second nodes, different than the first one of the first and second nodes, to a second differential output terminal, in response to the data signal;

coupling a first one of the first and second differential output terminals to a first current supply in response to an emphasis signal; and coupling a second one of the first and second differential output terminals, different than the first one of the first and second differential output terminals, to a second current supply in response to the emphasis signal.

22. A method of implementing a differential output driver, comprising:

providing an adjustable first pseudo-supply voltage to a first node in response to a first supply voltage-on a first voltage supply terminal, wherein providing the adjustable first pseudo-supply voltage comprises selecting a resistance of a first adjustable resistor coupled between the first voltage supply terminal and the first node, and wherein selecting a resistance of the first adjustable resistor comprises selecting a first number of parallel resistors to be switched into electrical connection between the first voltage supply terminal and the first node;

providing an adjustable second pseudo-supply voltage on a second node in response to a second supply voltage on a second voltage supply terminal;

coupling a first one of the first and second nodes to a first differential output terminal, in response to a data signal;

coupling a second one of the first and second nodes, different than the first one of the first and second nodes, to a second differential output terminal, in response to the data signal;

coupling a first one of the first and second differential output terminals to a first current supply in response to an emphasis signal; and coupling a second one of the first and second differential output terminals, different than the first one of the first and second differential output terminals, to a second current supply in response to the emphasis signal.

23. The method of claim 18 further comprising deriving the emphasis signal from the data signal.

24. The method of claim 23, further comprising time-shifting the data signal to provide the emphasis signal.

25. The method of claim 18, further comprising selecting the first pseudo-supply voltage from a first plurality of voltages, and selecting the second pseudo-supply voltage from a second plurality of voltages.

26. The method of claim 18, further adjusting currents of the first and second current supplies in response to the emphasis signal.

27. The method of claim 18, further comprising:

coupling a first one of the first and second differential output terminals to a third current supply in response to a second emphasis signal; and coupling a second one of the first and second differential output terminals, different than the first one of the first and second differential output terminals, to a fourth current supply in response to the second emphasis signal.

* * * * *